United States Patent [19]

Swanson

[11] Patent Number: 4,542,304
[45] Date of Patent: Sep. 17, 1985

[54] SWITCHED CAPACITOR FEEDBACK SAMPLE-AND-HOLD CIRCUIT

[75] Inventor: Eric J. Swanson, Reading, Pa.

[73] Assignee: AT&T Bell Laboratories, Murray Hill, N.J.

[21] Appl. No.: 451,026

[22] Filed: Dec. 20, 1982

[51] Int. Cl.⁴ .............................................. G11C 27/02
[52] U.S. Cl. .................................... 307/353; 307/359; 328/151
[58] Field of Search ....................... 307/352, 353, 359; 328/151, 162, 165, 167; 333/166

[56] References Cited

U.S. PATENT DOCUMENTS 3,586,880  6/1971  Fitzwater, Jr. ..................... 307/353
4,370,572  1/1983  Cosand et al. ..................... 307/353

Primary Examiner—John Zazworsky
Attorney, Agent, or Firm—Volker R. Ulbrich

[57] ABSTRACT

The feedback sample-and-hold stages of a transversal filter bank include a primary sample-and-hold branch and a secondary sample-and-hold branch for correction of offset voltage in the primary branch which results from switching charge feedthrough of its sampling switch. A pair of N-channel buffer transistors, one an enhancement type and one a depletion type, are so connected to the branches that power supply noise is attenuated. Additionally, the parasitic capacitance of the enhancement transistor acts as a coupling capacitor for the correction function.

4 Claims, 4 Drawing Figures

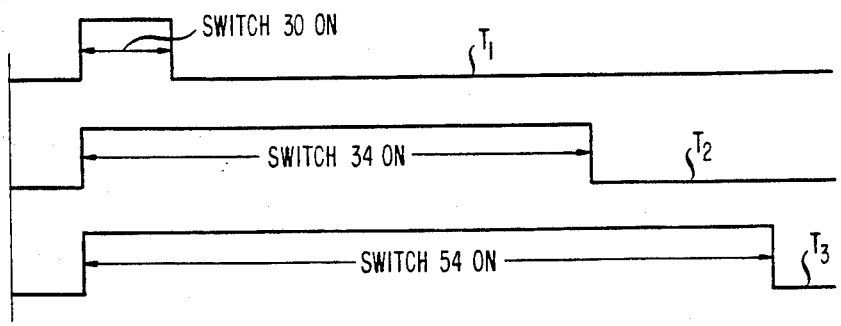
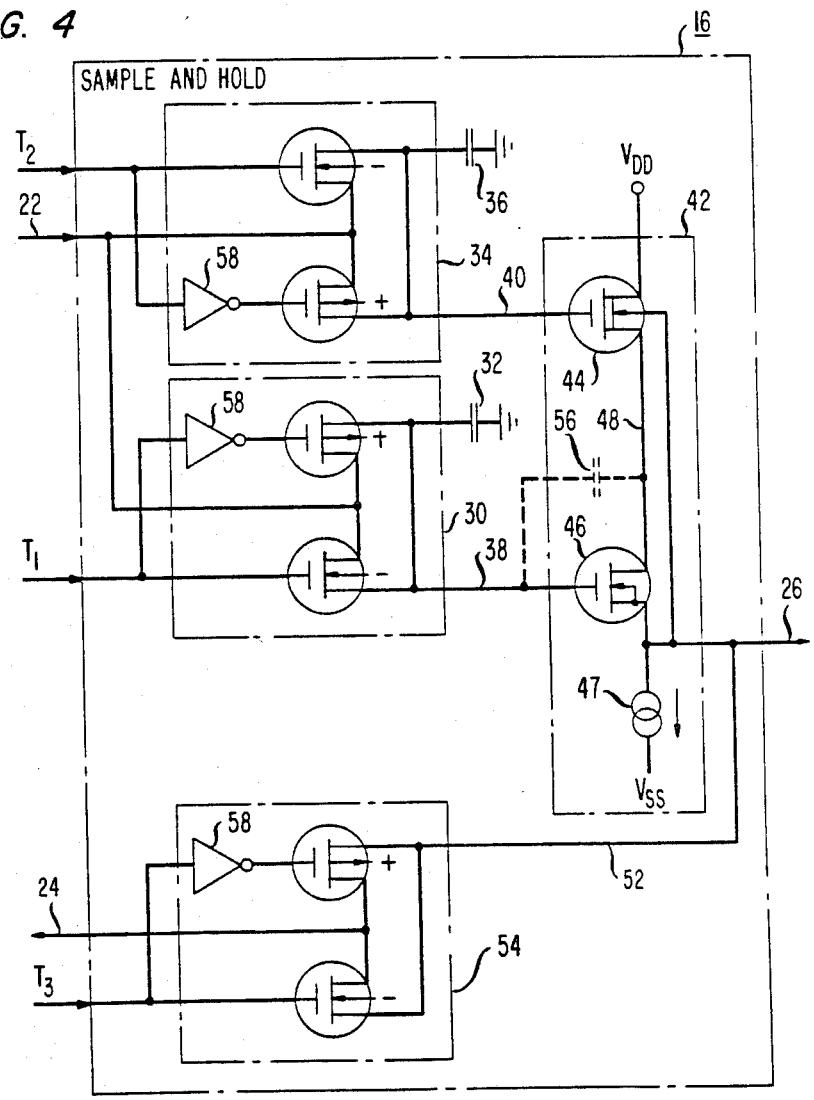

SWITCHED CAPACITOR FEEDBACK SAMPLE-AND-HOLD CIRCUIT

FIELD OF THE INVENTION

The invention relates generally to feedback sample-and-hold electronic circuits and relates more particularly to arrangements in which a plurality of such circuits in the form of stages are interconnected as a transversal filter bank and incorporated in an integrated circuit of the MOS (metal oxide semiconductor) type.

BACKGROUND OF THE INVENTION

Feedback sample-and-hold circuit transversal filter banks which rely upon MOS transistors to perform the function of the sampling switches present a problem with respect to both fixed pattern noise and power supply noise.

The fixed pattern noise arises from the characteristics of the MOS transistor switching devices. In each sample-and-hold stage, a holding capacitor is connected to the signal through an MOS sampling switch which is responsive to a switching pulse train from a switching control source. When the switch is operated from its conductive "on" condition to its resistive "off" condition by the pulse train to make the change from signal tracking to signal hold, there occurs a switching charge feedthrough error which affects the voltage on the holding capacitor and therefore introduces in the held signal what is generally referred to as a "feedthrough voltage offset". Small variations among the MOS switching transistors in a given circuit lead to a variation in the respective feedthrough voltage offsets among the stages of the bank and result in a fixed pattern noise in its output signal.

The power supply rejection problem relates to a buffer through which the output signal from the holding capacitor must be taken in order to provide d.c. (direct current) isolation of the holding capacitor from any circuitry connected to the output of the bank. The holding capacitor is connected to the gate of an MOS buffer transistor, usually a source follower. The drain of the buffer transistor is coupled to a power voltage rail. With this arrangement, the gate-to-drain capacitance of the buffer transistor provides a parasitic coupling of power supply noise to the holding capacitor.

SUMMARY OF THE INVENTION

In accordance with the present invention, the feedback sample-and-hold circuit section of each stage of a sample-and-hold transversal filter bank is of a dual feedback sample-and-hold type. A pair of N-channel buffer transistors, one an enhancement mode type and the other a depletion mode type, are so connected to the dual feedback sample-and-hold section that parasitic capacitance coupling between the holding capacitor and a power supply rail is substantially eliminated. Moreover, the arrangement is such as to provide a circuit element sharing in that the parasitic gate-to-drain capacitance of one of the buffer transistors provides the function of a coupling capacitor for the dual feedback sample-and-hold section. The dual feedback feature virtually eliminates the fixed pattern noise, while the complementary pair of buffer transistors provides greatly improved power supply noise rejection.

BRIEF DESCRIPTION OF THE DRAWING

FIG. 3 is a graphical representation of the timing sequence of the switches of the stage of FIG. 2.

FIG. 4 is a schematic circuit diagram of the stage of FIG. 2 showing the structure of the switches in more detail.

DETAILED DESCRIPTION

Figure 1:
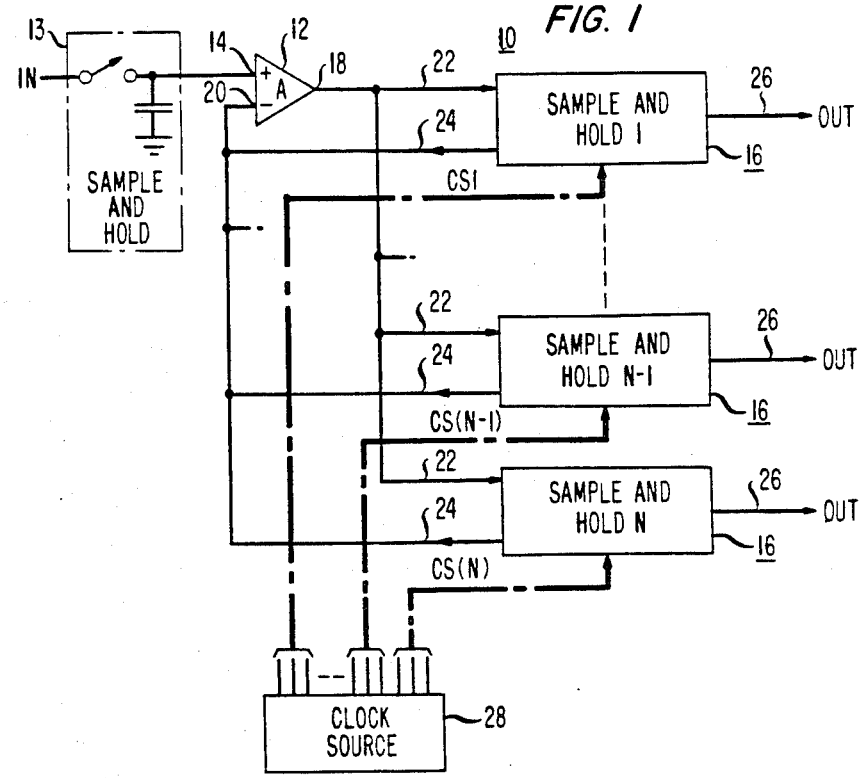
FIG. 1 is a schematic block circuit diagram showing a plurality of dual feedback sample-and-hold stages in accordance with the present invention interconnected as a sample-and-hold transversal filter bank.

FIG. 1 of the drawings shows a transversal filter bank 10. The filter bank 10 includes a high gain, high performance amplifier 12 which receives a signal from a simple sample-and-hold switch and capacitor combination at its noninverting input 14 and is shared by a plurality of interconnected, identical, feedback sample-and-hold stages 16. The output 18 of the amplifier 12 is connected as the input node 22 for the stage 16. The inverting input 20 of the amplifier 12 is connected to a feedback node 24 for the stages 16. The stages 16 sample-and-hold the signal in sequence and provide output signals to an output node 26, from which the signals may then pass to other circuitry for further utilization.

Figure 2:
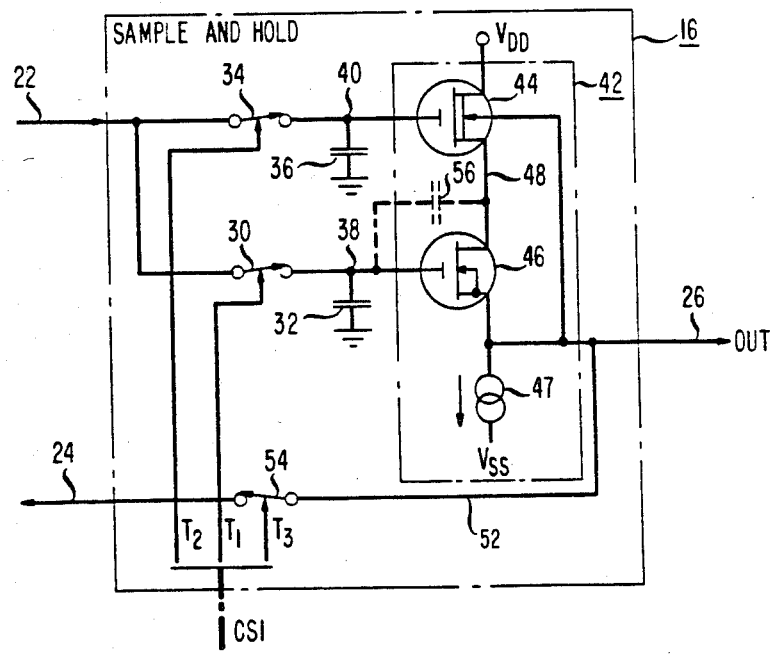
FIG. 2 is a schematic circuit diagram of one of the stages of the dual feedback sample-and-hold transversal filter bank of FIG. 1.

The sequential operation of the stages 16 is controlled by switching pulse trains from a clock source 28. Each stage 16 receives three switching pulse trains $T_1$, $T_2$, $T_3$, associated with that particular stage 16. The time sequence of these pulse trains $T_1$, $T_2$, $T_3$, and their intervals $T_1$, $T_2$, $T_3$ will be discussed in more detail later with respect to the mode of operation of the filter bank 10. One of the stages 16 is shown in more detail in FIG. 2. The stage 16 is of the dual feedback sample-and-hold type in which there is a primary sample-and-hold circuit and a secondary sample-and-hold circuit. The secondary circuit provides the primary circuit with correction of a voltage error introduced in the course of its operation. Such an arrangement is described in copending application Ser. No. 426,293 filed Sept. 29, 1982 for H. P. Lie and assigned to the same assignee as is the present invention.

The input node 22 leads to a primary sample-and-hold branch consisting of a primary sampling switch 30, hereinafter "sampling switch", in series with a primary holding capacitor 32, hereinafter "holding capacitor", which has its other side grounded. In parallel with this primary branch is a secondary, correction branch consisting of a correction sampling switch 34, hereinafter "correction switch", and a correction holding capacitor 36, hereinafter "correction capacitor", connected in series between the input node 22 and ground. The sample-and-hold primary signal is available at the common node 38 of the sampling switch 30 and the holding capacitor 32. The sample-and-held correction signal is available at the common node 40 of the correction switch 34 and the correction capacitor 36.

These held signal nodes 38, 40 are coupled to a buffer 42 which includes a pair of buffer transistors 44, 46. One is a depletion mode transistor 44 which has its drain connected to a power supply rail $V_{DD}$ and its gate connected to the correction common node 40. The other is an enhancement mode buffer transistor 46 which has its gate connected to the primary common node 38 and its source connected to a current source 47. The source of the depletion mode buffer transistor 44 is connected to the drain of the enhancement mode transistor 46 at the node 48. The bulk regions of both the buffer transistors 44, 46 are connected to the source of the enhancement mode transistor 46 at the output node 26. However, the depletion mode transistor 44 could have its bulk connected to its own source instead of to the source of the enhancement mode transistor 46.

Connected between the output node 26 and the inverting input (−) of the amplifier 12 there is a feedback line 52 which can be controlled by a feedback enabling switch 54. The sampling switches 30, the correction switch 34, and the feedback enable switch 54 are all single pole-single throw electronic switches which are implemented by MOS transistors. In the figure they are drawn as simple switches in order to facilitate a better understanding of the stage 16 by eliminating detail.

The sequential operation of the three switches 30, 34, 54 of the stage 16 is illustrated by the timing diagram of FIG. 3, in which the ordinate represents the voltage and the abscissa represents time. Each of the switches 30, 34, 54 is addressed by a separate switching pulse train $T_1$, $T_2$, $T_3$ from the clock source 28. The pulse trains will be identified by the time interval during which the switch associated with it is in the closed condition. Thus, $T_1$ identifies the pulse train from the clock source 28 which closes the sampling switch 30 for a time interval $T_1$; $T_2$ identifies the pulse train which closes the correction switch 34 for a time interval $T_2$; and, $T_3$ identifies the pulse train which closes the feedback enable switch 54 for a time interval $T_3$. The lines $T_1$, $T_2$, $T_3$ respectively associated with the switches 30, 34, 54 as indicated in the diagram represent the high-low voltage level of the switching pulse of the train. When the level is high, the switch is closed. When it is low, the switch is open. The feedback enable switch 54 is closed during the entire operation cycle interval $T_3$ of the stage 16. It is understood that during this interval the feedback enable switches 54 of all the other stages 16 of the filter bank 10 are open, thereby virtually disabling the other stages 16. Initially, both the sampling switch 30 and the correction switch 34 are closed during a first interval $T_1$ in which the holding capacitor 32 is tracking the voltage of the input node 22 through its sampling switch 30.

At the end of this first interval $T_1$, the sampling switch 30 is opened, while the correction switch 34 remains closed. At the end of the second interval $T_2$, the correction switch 34 also is opened. The effect of this switching sequence on the output of the stage 16 will be discussed in more detail below.

A coupling capacitor 56 connected between the node 48 and the primary common node 38 is shown in broken lines because it is actually the gate-to-drain parasitic capacitance of the enhancement mode buffer transistor 46. It provides a coupling between the primary common node 38 and the correction common node 40 during the second interval $T_2$ for correction of feedthrough voltage offset in the output signal.

When the sampling switch 30 opens at the end of the first switch interval $T_1$, it introduces a voltage offset on the holding capacitor 32. This results from a switching charge feedthrough error which is characteristic of MOS transistors. The correction switch 34, however, remains closed during the remainder of the second interval $T_2$, so that the correction signal from the correction common node 40 is coupled to the holding capacitor 32 via the parasitic gate-to-drain coupling capacitance 56. Due to the fact that the coupling capacitor 56 is considerably smaller than both the holding capacitor 32 and the correction capacitor 36, which are of roughly equal magnitude, the coupling of the correction capacitor 36 to the holding capacitor 32 is attenuated. As a result, when the correction switch 34 opens at the end of the second switch interval $T_2$ and itself generates a charge feedthrough error, the effect of this error on the signal level in the holding capacitor 32 is correspondingly attenuated and insignificant.

During the first switch interval $T_1$, the signal at the node 48 and that of the output node 26 follows that of the input node 22, although at a different d.c. (direct current) level, and both buffer transistors 44, 46 are serving as buffers. During the correction interval, the depletion mode buffer transistor 44 continues to function as a unity gain buffer to the source node 48, and the gate-to-drain overlap of the enhancement mode buffer transistor 46 acts as the coupling capacitor 56. Any parasitic coupling of noise in the power supply rail $V_{DD}$ to the correction capacitor 36, rather than to the primary holding capacitor 32. As a result, the effect of such noise on the output signal of the stage 16 at the output node 26 is greatly attenuated, since the parasitic gate-to-drain capacitance of either the depletion mode buffer transistor 44 or the enhancement mode buffer transistor 46 is typically about 30 times smaller than the value of the correction capacitor 36 or the holding capacitor 32.

FIG. 4 shows the stage 16 of FIG. 3 in more detail. The switches 30, 34 and 54 are each a known combination of two enhancement mode complementary MOS transistors connected in parallel to form a symmetric transistor arrangement which functions as a single toggle switch. The P-channel member of the pair of transistors receives the control source pulses through an inverter 58. Such a parallel arrangement partially cancels switching charge feedthroughs and reduces body effect problems which would be more prominent with the single transistor. Each of the switches 30, 34 and 54 is shown receiving its respective switching pulse trains $T_1$, $T_2$, $T_3$ from the clock source 28. The source of the enhancement mode buffer transistor 46 is shown connected to the bias current source 47. The "+" and "−" notations of the transistors in the FIG. 4 indicate that the bulk region is connected to a positive or negative respective supply voltage.

GENERAL CONSIDERATIONS

For typical practical application of the feedback sample-and-hold transversal filter bank 10, e.g., where the input signal to the amplifier is audio frequency or higher, it is advisable to provide a sample-and-hold of the incoming signal such as is provided by the circuit 13 for the stage 16 before the input 14 of the amplifier 12. This prevents the signal level at the output 18 of the amplifier 12 from undergoing significant change during the time that the correction capacitor 36 is being charged and thereby interfering with the accuracy of the correction. For signals of a low enough frequency, the circuit 13 can be omitted.

Although the above discussion involves a bank 10 of sample-and-hold stages 16 which are coupled to each other, it should be understood that a single stage 16 could also be used in conjunction with the amplifier 12 to perform a useful low offset voltage feedback sample-and-hold function.

The primary and secondary sample-and-hold branches can be any suitable sample-and-hold sample configuration and need not necessarily be the particular arrangement of a single sampling switch 30 and holding capacitor 32 as described for the stage 16 of the bank 10.

The various "ground" potential nodes of the stage 16 in accordance with the invention are at some reference potential, which need not necessarily be the same for all these nodes. In fact, in some instances it may be advantageous that they be at different levels.

The magnitude ratio of the coupling capacitor 56 to the storage capacitor 32 is determined for the particular circuit application. For a given signal bandwidth, the amount of correction depends on the performance characteristics of the operational amplifier 12 and the amount of switching charge feedthrough that the switches 30, 34 permit. Typical values of the ratio for telephony signals can be expected to be between 20 and 60.

It is apparent that any of the above-described circuits could be realized with devices of opposite polarity conduction channels with respect to those of the corresponding devices of the circuit in question, with the voltage supply source means polarities also being reversed accordingly.

While in the above-described apparatus the correction sample-and-hold branch of the sample-and-hold stage 16 is coupled to the primary sample-and-hold branch by a unity gain buffer in the form of the depletion mode transistor 44, such buffered coupling may be provided by other means, such as, for example, a P-channel source follower configuration for driving the drain of the N-channel enhancement mode transistor 46. This buffer need not be unity-gain, since any loss in it will simply add to the attenuation of the coupling between the primary and the correction branches. In general, this buffer will have an output impedance which is low compared to the impedance at the drain of the enhancement mode transistor 46 and should not have a voltage drop so great that the enhancement mode transistor 46 is put outside its active operating range by too low a source-to-drain voltage.

What is claimed is:

1. A sample-and-hold circuit apparatus of the type comprising:
    an amplifier having an inverting input port, a noninverting input port, and an output port;
    a buffer, comprising an enhancement mode transistor having a gate electrode which forms an input port of said buffer and having a drain-to-source conduction path which at one side forms an output port of said buffer;
    a sampling switch connected between a signal input and the input port of said buffer;
    a holding capacitor connected at a first side to the input port of said buffer and at a second side to a reference potential;
    a feedback means connected to the output port of said buffer and coupled to an input port of said amplifier;
    a correction switch connected at a first side to the output port of said amplifier;
    a correction holding capacitor connected at a first side to a reference potential and at a second side to a second side of said correction switch, and
    means coupling a second side of said correction switch to the drain of said enhancement mode transistor.

2. The circuit as defined in claim 1 wherein said coupling means comprises a depletion mode transistor having its gate connected to the second side of said correction switch and its drain-to-source conduction path connected to a bias current means.

3. The circuit as defined in claim 2 wherein said enhancement and said depletion transistors have the same conduction channel polarity, said depletion mode transistor having its source connected to the drain of said enhancement mode transistor and its drain connected to a positive supply voltage means, the source of said enhancement transistor being connected in series with a bias current source means to a negative supply voltage means.

4. The circuit as defined in claim 3 comprising means for sampling and holding a signal prior to the entering of the signal into the noninverting input port of said amplifier.

* * * * *